United States Patent [19]
Naito et al.

[11] Patent Number: 5,856,219
[45] Date of Patent: Jan. 5, 1999

[54] METHOD OF FABRICATING A HIGH-DENSITY DYNAMIC RANDOM-ACCESS MEMORY

[75] Inventors: Yasushi Naito, Osaka; Yutaka Ito, Hyogo; Yuichi Hirofuji, Osaka, all of Japan

[73] Assignee: Matsushita Electric Industrial Co., Ltd., Osaka, Japan

[21] Appl. No.: 912,686

[22] Filed: Aug. 18, 1997

Related U.S. Application Data

[62] Division of Ser. No. 726,233, Oct. 4, 1996, abandoned, which is a continuation of Ser. No. 494,936, Jun. 26, 1995, abandoned, which is a continuation of Ser. No. 159,583, Dec. 1, 1993, abandoned.

[30] Foreign Application Priority Data

Dec. 2, 1992 [JP] Japan ..................................... 4-323361

[51] Int. Cl.$^6$ ............................................. H01L 21/8242
[52] U.S. Cl. ........................... 438/241; 438/266; 438/275
[58] Field of Search ..................................... 438/241, 238, 438/266, 275, 279

[56] References Cited

U.S. PATENT DOCUMENTS 4,882,289  11/1989  Moriuchi et al. .
5,389,558  2/1995  Suwanai et al. .

*Primary Examiner*—Tuan H. Nguyen
*Attorney, Agent, or Firm*—McDermott, Will & Emery

[57] ABSTRACT

The invention relates to a high-density DRAM fabrication technique for forming a source/drain contact between word lines in a self-alignment manner, with the offset length between a source region and a drain region of a peripheral transistor maintained at an adequate value. After gate electrodes (i.e. word lines) are formed, a first insulating layer, which is thin enough not to block up space defined between the word lines, is deposited. The source/drain contact is etched as deep as the first insulating layer is thick to form an extraction electrode made of polycrystalline silicon. A second insulating layer is deposited until a spacer thickness (i.e. the sum of the film thickness of the second insulating layer and the film thickness of the first insulating layer) for determining the offset length is obtained. The first and second insulating layers are etched back for a distance corresponding to the sum of the film thickness of the second insulating layer and the film thickness of the first insulating layer so that a spacer (i.e. the residue of the insulating layers) is left on the side walls of the gate electrode. An implantation of highlevel impurities is performed to form heavily doped source and drain regions of a peripheral transistor. In-cell self-align contact is made possible while maintaining the offset length of the heavily doped source and drain regions

5 Claims, 6 Drawing Sheets

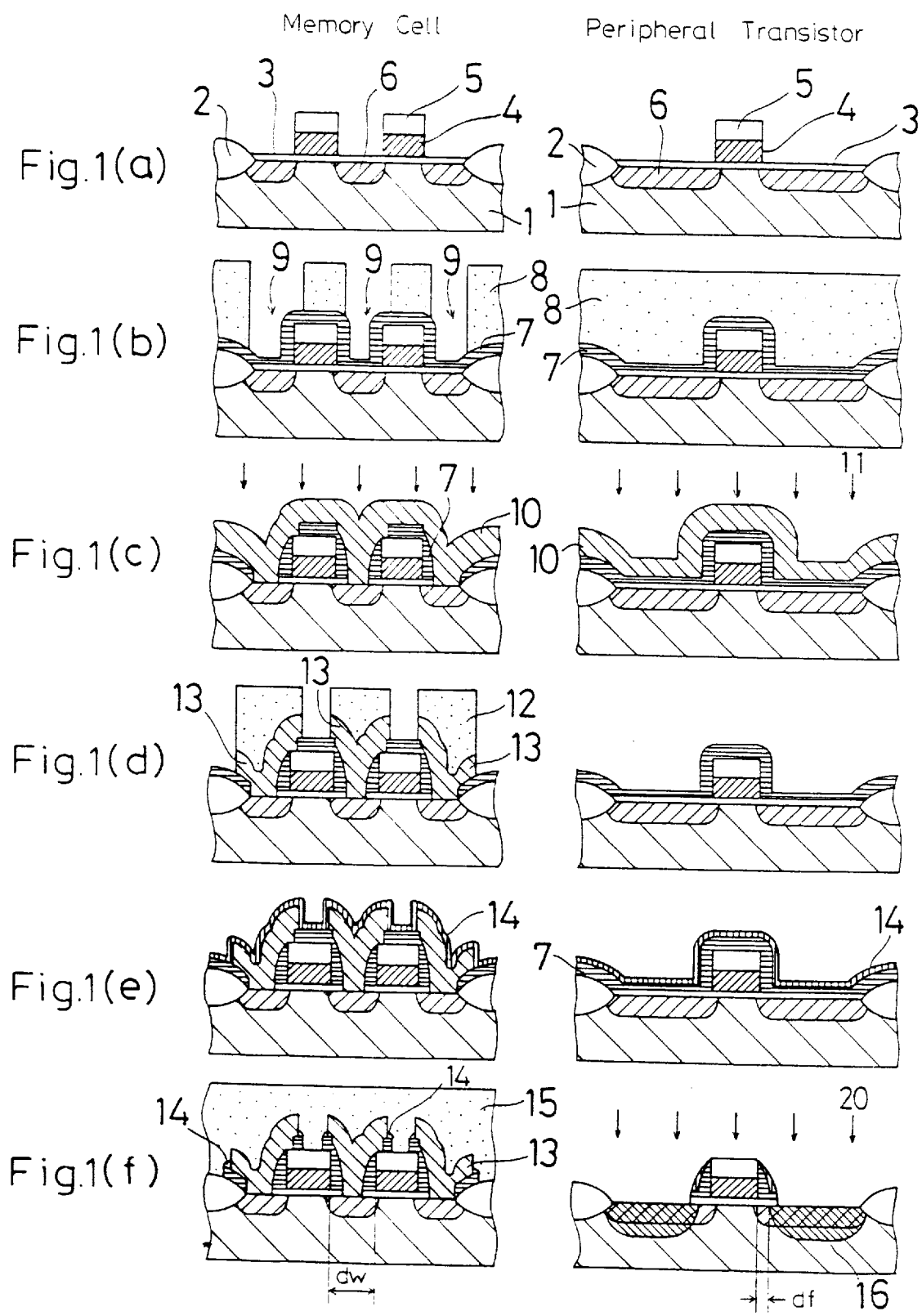

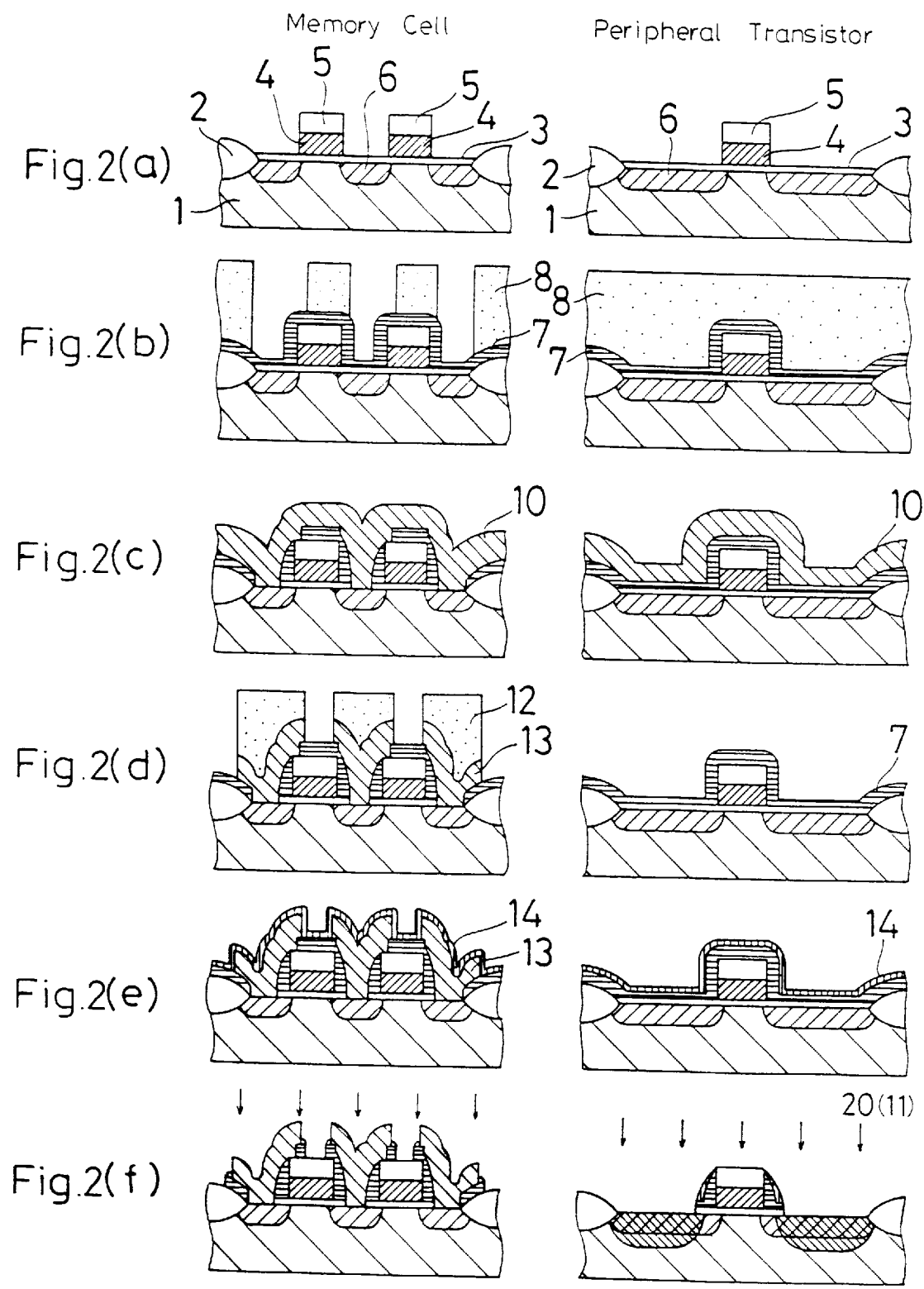

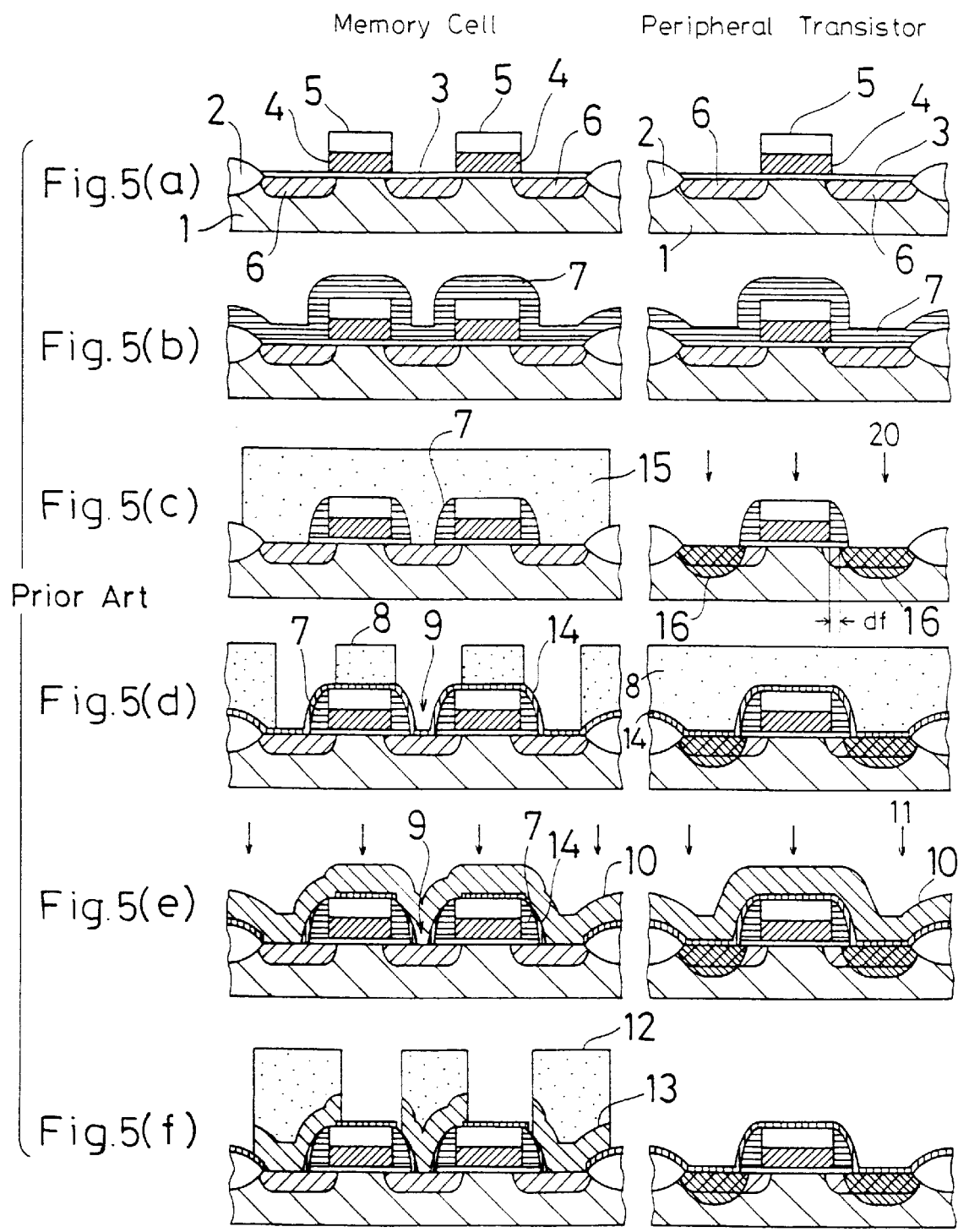

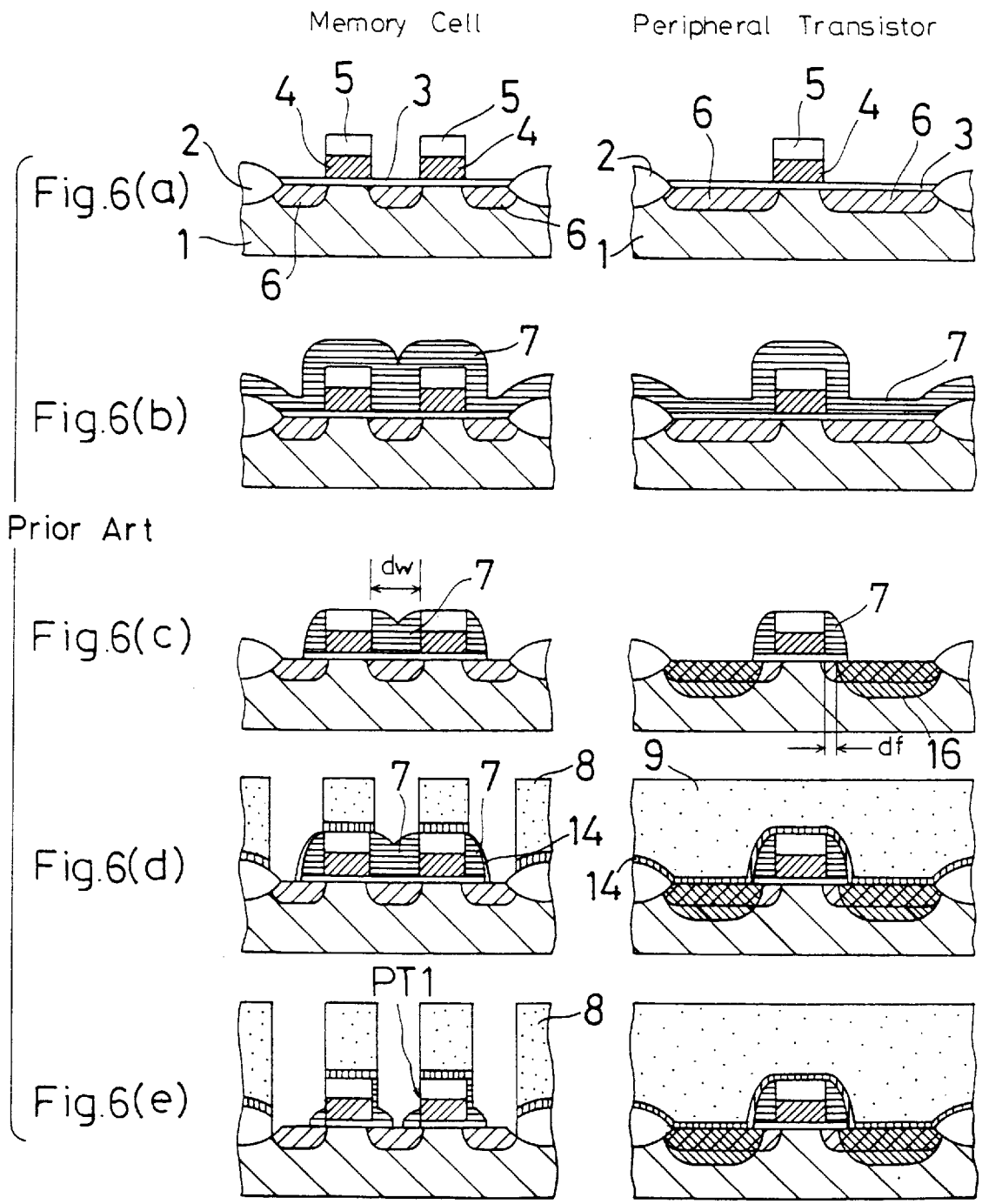

METHOD OF FABRICATING A HIGH-DENSITY DYNAMIC RANDOM-ACCESS MEMORY

This is a divisional of Ser. No.08/726,233, filed Oct.4, 1996, abandoned which is a file wrapper continuation of Ser. No.08/494,936, filed Jun.26, 1995, now abandoned, which was a file wrapper continuation of 08/159,583, filed Dec.1, 1993, now also abandoned.

TECHNICAL FIELD OF THE INVENTION

The present invention generally relates to high-density dynamic random-access memories (DRAM). More specifically, this invention pertains to an extraction electrode connecting the bit line, capacity electrode, and the like to the source and drain.

BACKGROUND OF THE INVENTION

In high-density DRAMs, a great number of gate electrodes (i.e. word lines) are very closely spaced one another in a memory cell and the gap between the word lines is very narrow. Connection, for example, between the bit line and the source and drain, is made through such an extremely cramped gap. As the density of DRAMs increases, such a gap is made smaller and smaller. Existing photolithography techniques, however, present such a problem that the size of openable contact holes cannot be reduced with the demagnification ratio of the word line pitch, thereby giving rise to the overlapping of a hole pattern with a word line.

Therefore, the formation of contact to the source and rain must be carried out in a self-alignment manner with respect to the word line. Self-alignment up to the generation of 64M-bit DRAMs has been done using a spacer, made of an insulating layer, formed on the side wall of a gate.

Originally, such a spacer is used to hold a source region (or a drain region) being formed and a gate electrode at a given distance from each other when carrying out an implantation of impurities, particularly in transistors in a peripheral circuit (for example, ones in row and column decoders). In other words, an extraction electrode, made of polycrystalline silicon, is formed in a self-align manner with the help of a spacer, and connection to upper-layer wirings is established through the extraction electrode.

Referring now to the drawings, the above-described prior art technique is described. FIGS. 5a-5f are cross-sectional views depicting successive stages of the fabrication of a DRAM by means of a conventional self-alignment technique. Each of FIGS. 5a-5f depicts in cross section a memory cell on the left side and a peripheral transistor on the right side.

First, as shown in FIG. 5a, an isolation region 2 and a gate oxide 3 are formed on a silicon substrate 1. Material from which a gate electrode is made is deposited, and material from which an insulating layer is made is deposited. These two deposited layers are etched one after another using the same mask, whereby a gate electrode 4 constituting a word line and an upper insulating layer 5 are formed. Further, using the gate electrode 4, upper dielectric layer 5, and isolation region 2 as a part of a mask, an implantation of ions is carried out from above the silicon substrate 1 to create a lightly doped source (drain) 6. Usually, peripheral transistors are formed by CMOSs, in which case their type (p. n) is decided as required and they are formed using a resist mask or the like.

Next, as shown in FIG. 5b, a first insulating layer 7 having an adequate thickness is deposited. Then, as shown in FIG. 5c, the entire surface of the first insulating layer 7 is anisotropically etched in such a way that the first insulating layer 7 is left only on the side walls of the gate electrode 4. As shown in FIG. 5c-L(eft), by using such a residual first insulating layer 7 as a part of a mask, an implantation of ions, as indicated by arrows 20, is carried out to create a heavily doped source (drain) 16. In other words, the residual first insulating layer 7 serves as a spacer determining a transistor offset length df. Here, the heavily doped source (drain) 16 is defined as a region with a dosage of 1E20cm-3 ions or more, and the offset length df is the distance from the gate end to the region 16. The reliability of transistors and the short channel effect are influenced by the offset length df. In order to provide favorable transistor characteristics, the spacer is required to have a thickness of 120 nm or more even in a heat treatment in which heat treatment time is shortened to a production limit.

If, during the foregoing ion implantation, impurities enter a memory cell when carrying out the aforesaid ion implantation 20, this is likely to damage that memory cell. Therefore, as shown in FIG. 5c-R(ight), the memory cell is masked with a resist 15. More specifically, such masking is done by giving a resist mask used to form n-type peripheral transistors a particular mask pattern so as to cover the memory cell. Now, the transistor fabrication is completed.

Next, an extraction electrode 13, made of polycrystalline silicon, is formed as follows. As shown in FIG. 5d-L, a second insulating layer 14 which is a comparatively thin layer is deposited on the entire surface of the silicon substrate 1, and a self-aligned contact 9 is pattern-formed using a photoresist 8. For the case of 64M-bit DRAMs, the gap between word lines is below 0.5 μm, and resist hole patterns have a limitation of 0.4 μm. Additionally, taking into account the fact that the generation of 64M-bit DRAMs has an alignment accuracy limitation of 0.1 μm, the occurrence of the overlap of the contact 9 and the gate electrode 4 is unavoidable. Therefore, in order to open up a contact in a self-align manner, contact etching must be carried out for a distance corresponding to the film thickness of the second insulating layer 14, that is, as deep as the second insulating layer 14 is thick. The second insulating layer 14 is given a comparatively thin film thickness and thus the gap between gates is not filled up with the layer 14. Therefore, the surface of the silicon substrate can be exposed by carrying out a slight etching, whereby a contact can be opened in a self-align manner. If such an etching extends beneath the second insulating layer 14, this leads to an unwanted contact to a word line since a resist opening overlaps with the gate electrode 4. Self-alignment becomes unavailable as a result.

Next, as shown in FIG. 5e, a polycrystalline silicon layer 10 is deposited. Then, the polycrystalline silicon layer 10 is subjected to an implantation of ions as indicated by arrows 11. Further, as shown in FIG. 5f, by using a resist mask 12, the polycrystalline silicon layer 10 is processed into a predetermined form to form the extraction electrode 13. The polycrystalline silicon of the polycrystalline silicon layer 10 is easily etched at high etch selectivity with respect to the underlaying insulating layers 7 and 14 by a reactive ion etching technique (RIE) sing, for example, HBr. Therefore, no residual matters will be left at steep step portions created by the gate electrode 4 and thus a residue-free process can be obtained.

The extraction electrode 13 is pre-formed for ease of connection. More specifically, when threading down between closely arranged word lines so as to establish connection, what is required is just to open a contact as far as the extraction electrode 13. Therefore, self-alignment with respect to a word line is possible. If the extraction electrode 13 is made of such upper-layer wiring materials as aluminum and metal silicide, over etching cannot be carried out due to low etch selectivity with respect to the first and second insulating layers 7 and 14 and therefore the residue is left at steep step portions created by the gate electrode 4. In order to avoid such a problem, the extraction electrode 13 is preferably made of polycrystalline silicon.

The above-described fabrication technique, however, is not suitable for the next generation, 256M-bit DRAMs.

When trying to increase the DRAM density, it is desirable that the dimensions and the film thickness should be reduced at the same demagnification ratio. If such is possible, the foregoing fabrication technique of FIGS. 5a-5f becomes practical. However, it is not possible to reduce the spacer thickness specifying the offset length df with the demagnification ratio of the word line pitch. Under actual heat treatment conditions, it is very difficult to reduce the diffusion of impurities used to create heavily doped regions at the same demagnification ratio. Therefore, if the spacer thickness is reduced too thin, the short channel effect becomes significant resulting in the malfunction of transistors. As a result, the spacer-thickness demagnification ratio must be lower than the word-line demagnification ratio.

FIGS. 6a to 6e illustrate in cross section successive stages of the fabrication of a high-density DRAM in which an extraction electrode is formed in the same way as shown in FIGS. 5a-5f, but under a different condition where the word line pitch is further made smaller.

In FIG. 6a, the lightly doped source (drain) 6 is created. In the 256M-bit DRAM class, a word line-to-word line gap dw is somewhere between 0.20 μm and 0.25 μm, while the required spacer thickness is from 0.125 μm to 0.150 μm. he first insulating layer 7 is deposited (see FIG. 6b). hen, the first insulating layer 7 is so etched back that its residue is left on the side walls of the gate electrode As shown in FIG. 6c, a gap between each word line (i.e. each gate electrode 4) is filled up with the first insulating layer 7. If self-alignment is tried under such state in the same way as shown in FIGS. Sd to Sf, the silicon surface of the silicon substrate 1 will not be exposed by an etching carried out to the second insulating layer 14 alone (see FIG. 6d).

If anisotropic etching is carried out until the silicon surface has emerged between the gate electrodes 4, this results in removing parts of the insulating layers 7 and 14 from the side walls of the gate electrode 4 (see PT1 of FIG. 6e). If an extraction electrode is formed between the gate electrodes 4 whose side wall insulating layers have been removed partly, both the electrodes come to contact with each other. For the case of the 64M-bit DRAM class, there is no need for worrying about such a problem because dw is from 0.4 μm to 0.5 μm and df is about 0.15 μm. For the case of the 256M-bit DRAM class, however. there are difficulties in forming extraction electrodes since dw is reduced while the spacer thickness remains unchanged.

It is understood from the above that, when making high-density DRAMs by means of the above-described fabrication technique, the spacer thickness conflicts with the in-cell self-alignment.

DISCLOSURE OF THE INVENTION

Bearing in mind the foregoing problems accompanied with the prior art techniques, the present invention was made.

The present invention provides a high-density DRAM fabrication technique. In accordance with this technique, up to the stage when an extraction electrode is formed at a gap between word lines for establishing source/drain contact, the side walls of a gate electrode are covered with a first insulating layer that is thin enough to secure insulation between the gate electrode and an extraction electrode being formed at a later stage. After the extraction electrode is formed, a second insulating layer, which determines the spacer thickness required for a peripheral transistor, is deposited on the first insulating layer. Then, a spacer, formed by these two layers, defines areas where heavily doped source and drain regions should be formed.

More specifically, the present invention discloses a method of fabricating a high-density DRAM comprising a memory cell and its peripheral transistor. This fabrication method comprises the sequential steps of:

(a) forming a gate electrode of a MOS transistor and an upper insulating layer on top of the gate electrode in the memory cell as well as in the peripheral circuit;

(b) depositing a first insulating layer having a uniform film thickness on top of the memory cell as well as on top of the peripheral circuit;

(c) carrying out an anisotropic etching to the first insulating layer deposited on the memory cell to such an extent that at least the upper insulating layer and the first insulating layer on the side of the gate electrode are left whereby a source/drain contact surface is exposed. and forming an extraction electrode on the source/drain contact surface;

(d) depositing a second insulating layer on the memory cell as well as on the peripheral circuit;

(e) carrying out an anisotropic etching to the first and second insulating layers, for selective removal in such a manner that they are left on the side walls of the gate electrode whereby at least source and drain regions of the peripheral circuit are exposed; and (f) forming heavily doped source and drain regions in the peripheral circuit by introducing impurities of a high concentration using partly or entirely the residual first and second insulating layers of the step (e) as a mask.

As a result of the above-described arrangement, the formation of in-cell self-aligned contact which requires a thin insulating layer and the formation of a spacer used at the time of an implantation of high-level impurities to create heavily doped source and drain regions of a peripheral transistor which, on the other hand, requires a thick insulating layer do not conflict with each other. Therefore, the DRAM fabrication can be completed smoothly.

Additionally, the above-described method is preferably performed under the following conditions.

(1) The film thickness of the first insulating layer is preferably smaller than one-half of the minimum distance between the gate electrodes of a source/drain contact area in the memory cell. Such produces an advantage. That is, before carrying out anisotropic etching, or at the stage at which the first insulating layer has been deposited, enough space for the formation of the extraction electrode is already secured in a source/drain contact area. This facilities the formation of the extraction electrode.

(2) Preferably, the film thickness of the second insulating layer is so determined that the sum of the film thickness of the first insulating layer and the film thickness of the second insulating layer is greater than one-half of the minimum distance between the gate electrodes of the source/drain contact area of the memory cell. As a result of such an arrangement, the spacer thickness which plays an important role when introducing high-level impurities into the peripheral circuit for the formation of heavily doped regions is kept at an adequate value. Therefore, transistor characteristic variations become stable with respect to reduction variations, and reliability improves.

(3) The film thickness of the upper insulating layer is referably greater than 20% of the film thickness of the first insulating layer. As a result of this arrangement, even if 15% or less over-etching occurs when carrying out an anisotropic etching against the first insulating layer before the formation of the extraction electrode, the film thickness of the upper insulating layer is maintained thick enough to secure insulation.

(4) Preferably, the extraction electrode is formed by polycrystalline silicon, and an implantation of impurities into the polycrystalline silicon of the extraction electrode and an implantation of impurities into the peripheral circuit to create the heavily doped n-type source and drain regions are carried out at the same time. This reduces the number of fabrication stages.

Additionally, the present invention discloses a highdensity DRAM. This DRAM comprises a memory cell and its peripheral circuit in which: the memory cell comprising:

(a) a plurality of source regions and a plurality of drain regions provided at given distance intervals on a semiconductor substrate;

(b) a gate electrode provided between the source region and the drain region; and (c) an extraction electrode provided for the source and drain regions;

the peripheral circuit comprising:

(a') at least two high-level impurity diffusion regions provided at given distance intervals on the semiconductor substrate;

(b') a gate electrode provided between the impurity diffusion regions;

wherein:

a first insulating layer is formed on the side walls of the gate electrode of the memory cell for electrical insulation between the extraction electrode and the gate electrode; and the side walls of at least one of the gate electrodes of the peripheral circuit are covered with a first insulating layer deposited at the same time when the first layer of the memory cell was deposited and with an overlaying, second insulating layer, and the value obtained by subtracting the impurity diffusion length from the sum of the film thickness of the first insullayer and the film thickness of the second insulating layer is equal to the offset length from the gate electrode of the impurity diffusion region.

As a result of the above-described arrangement, the formation of in-cell self-aligned contact is achievable while keeping the peripheral transistor offset length at an adequate value.

Additionally, the above-described DRAM is preferably added the following features.

(1) The film thickness of the first insulating layer is referably smaller than one-half of the minimum distance between the gate electrode of a source/drain contact area in the memory cell. Such produces an advantage. That is, before carrying out anisotropic etching, or at the stage at which the first insulating layer has been deposited, enough space for the formation of the contact of the extraction electrode is already secured in a source/drain contact. This facilities the formation of the extraction electrode.

(2) Preferably, the sum of the film thickness of the first insulating layer and the film thickness of the second insulating layer is greater than one-half of the minimum distance between the gate electrodes of a source/drain contact are in the memory cell. As a result of such an arrangement, the spacer thickness which plays an important role when introducing high-level impurities into the peripheral transistor for the formation of heavily doped regions is kept at an adequate value. Therefore, transistor characteristic variations become stable with respect to production variations, and reliability improves.

(3) The film thickness of the upper insulating layer of the gate electrode of the memory cell is preferably greater than 20% of the film thickness of the first insulating layer. As a result of this arrangement, even if 15% or less over-etching occurs when carrying out an anisotropic etching against the first insulating layer before the formation of the extraction electrode, the film thickness of the upper insulating layer is maintained thick enough to secure insulation.

(4) The source, drain, and channel regions of the memory cell are completely covered with the extraction electrode, second insulating layer left at the periphery of the extraction electrode, gate electrode, and first and second insulating layers left at the periphery of the gate electrode. As a result of such an arrangement. even if, when making DRAMS, an implantation of impurities into the extraction electrode and an implantation of high-level impurities into the peripheral transistor to create heavily doped source and drain regions are performed at the same time, the memory cell is protected from being implanted with such high-level impurities. Therefore, the occurrence of implantation defects can be prevented while at the same time simplifying the DRAM fabrication.

BRIEF DESCRIPTION OF THE DRAWINGS

In the drawings in which:

FIGS. 1a–1f illustrate in cross section successive stages of the fabrication of a high-density DRAM of a first preerred embodiment of the present invention;

FIGS. 2a-2f illustrate in cross section successive stages of the fabrication of a high-density DRAM of a second preerred embodiment of the present invention;

FIGS. 5a-5f illustrate in cross section successive stages of the fabrication of a DRAM by means of a prior art technique; and FIGS. 6a-6e illustrate in cross section successive stages of the fabrication of a comparatively higher-density DRAM by means of a prior art technique.

DESCRIPTION OF THE PREFERRED EMBODIMENTS

Figure 3A:
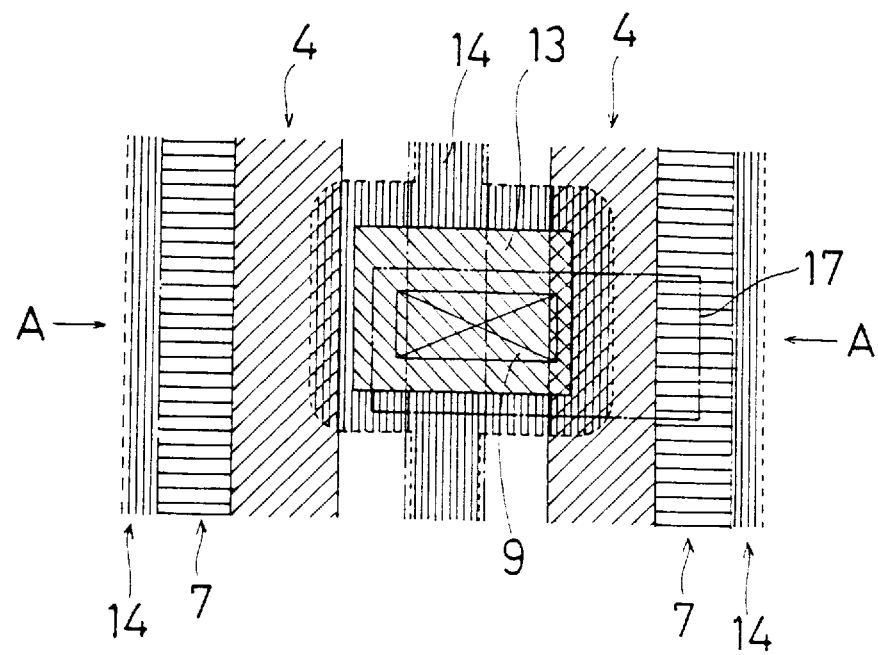
FIG. 3a is a plan view showing the structure of a memory cell of the high-density DRAM of the second preferred embodiment.

Preferred embodiments of the invention are now described below by making reference to the accompanying drawings.

Example I

A first preferred embodiment is explained by reference to FIGS. 1a-1f. Each of FIGS. la-lf depicts a part of a memory cell on its left side and a part of a peripheral transistor on its right side.

In the first place, an isolation region 2 having a thickness of 300 nm is formed on a silicon substrate 1 by means of an LOCOS technique. A gate oxide 3 is deposited 9 nm by thermal oxidization, and polycrystalline silicon as a gate electrode material is deposited 120 nm. Phosphorus is introduced by thermal gaseous diffusion from POC13 gas into the polycrystalline silicon, as a result of which the polycrystalline silicon comes to have a lower electrical resistance. A layer of CVDHTO is deposited 130 nm as an insulating layer. These two layers are etched one after another with the same resist mask to form a gate electrode 4 serving as a word line and an upper insulating layer 5 on top of the gate electrode 4. Next, by using the gate electrode 4, upper insulating layer 5, and isolation region 2 as a part of a mask, lightly doped sources (drain) 6 are formed in the memory cell transistor as well as in the peripheral n-type transistor by carrying out an implantation of arsenic ions at an implantation energy of 80 keV at a dosage of $3E13cm^{-2}$, (see FIG. 1a). Since the peripheral transistor is formed by a CMOS, the p-type channel region must be shielded by a resist mask at the foregoing stage. Further, in order to form a lightly doped source (drain) in a p-type channel transistor, an implantation of BF2 ions is carried out at an implantation energy of 40 keV at a dosage of $3E13cm^{-2}$, with the n-type channel region shielded by a resist mask.

Next, a first insulating layer 7, made of CVDHTO, is deposited 80 nm, as a result of which the gap between the gate electrodes 4 is not filled up with the layer 7 and insulation between the gate electrode 4 and an extraction electrode being formed at a later stage can be obtained. Then. a self-aligned contact 9 is formed using a photoresist 8 (see FIG. 1b).

Thereafter, by using the photoresist 8 as a mask, the first insulating layer 7 undergoes an anisotropic etching, as a result of which the silicon surface is exposed between the gate electrodes 4. As a stopper, the upper insulating layer 5 must be thick enough not to be removed from above the gate electrode 4 due to over-etching. As a result of such an arrangement (that is, the upper insulating layer 5: 130 nm thick; the first insulating layer 7: 80 nm thick), even if the first insulating layer 7 is over-etched by 30 nm , the upper insulating layer 5 still has a thickness of 100 nm. Therefore, the gate electrode 4 will be well insulated.

After the provision of a contact, a polycrystalline silicon layer 10 is deposited 100 nm, which is subjected to an implantation of arsenic ions, as indicated by arrows 11, at an implantation energy of 40 keV at a dosage of $6E15cm^{-2}$(see FIG. 1c)

Next, by the use of a resist mask 12, the polycrystalline silicon layer 10 is anisotropically etched to form an extraction electrode 13 having a desired pattern (see FIG. 1d).

Thereafter, a second insulating layer 14 is so deposited that the sum of the film thickness of the layer 14 and the film thickness of the layer 7 comes to be an adequate thickness for forming a spacer used to offset a peripheral transistor gate electrode against a heavily doped source (drain) (see FIG. 1e). If the second insulating layer 14 is deposited 60 nm, the total thickness of the first and second insulating layers 7 and 14 is 140 nm which is an adequate spacer thickness.

These first and second insulating layers 7 and 14 are anisotropically etched by 140 nm in such a manner that they are left on the side walls of the gate electrode 4 as a spacer (see FIG. 1f-R). By using the spacer as a part of a mask, an implantation of ions, as indicated by arrows 20, is carried out to form a heavily doped source (drain) 16. Ion implantation for n-type channel and ion implantation for p-type channel are carried out separately (As, 40 keV, $6E15cm^{-2}$; BF2, 40 keV, $4E15cm^{-2}$). When carrying out an ion implantation for n-or p-type channel, the opposite type channel must be covered with a resist mask for protection. Particularly, when introducing impurities for n-type channel, the memory cell must be masked with the resist 15. If arsenic of a high concentration is implanted into the source (drain) 6 of the memory cell, crystal defects occur in the silicon substrate 1 and pause time failures occur.

As described above, the extraction electrode 13 for self-alignment and peripheral transistors are formed.

In accordance with the present embodiment, the extraction electrode 13 is provided between the gate electrodes 4 (word 5 lines), before the formation of the heavily doped source (drain) region 16. This makes it possible to reduce to a minimum insulation requirement the film thickness of the first insulating layer 7 on the side walls of the gate electrode 4. Conversely, in prior art techniques in which the heavily doped source (drain) 16 of the peripheral transistor is formed before the formation of the extraction electrode 13. This requires a thick insulating layer to be formed entirely so as to obtain the offset length df with respect to the gate electrode 4 of the heavily doped source (drain) 16, and if df is narrowed as the density of DRAMs increases, the gap between the gate electrodes 4 is likely to be filled up with such a bulky insulating layer. Therefore, the formation of extraction electrodes cannot be carried out smoothly.

In accordance with the present embodiment, the first insulating layer 7 has a thickness just enough to provide insulation, say, 80 nm. This thinness is well applicable even to the 256 M-bit DRAM class whose df is about 0.20 to 0.25 $\mu$m, and the gap defined between the gate electrodes 4 will not be filled up with the first insulating layer 7, thereby facilitating the formation of the extraction electrode 13 which is used to form the self-aligned contact 9.

Thereafter, the second insulating layer 14 is deposited on the first insulating layer 7. By taking the value, obtained by subtracting the diffusion distance of high-level impurities from the sum of the film thickness of the layer 7 and the film thickness of the layer 14, as a required spacer thickness (for example, about 140 nm) according to which the offset length df of the heavily doped source (drain) 16 to the gate electrode 4 is determined, the formation of the heavily doped region 16, too, can be carried out smoothly.

Therefore, the spacer thickness of the heavily doped source (drain) 16 is kept at an adequate value while at the same time the formation of the extraction electrode 13 which is used to form the self-aligned contact 9 can be carried out reasonably.

The number of fabrication stages in the present embodiment is equal to the number of fabrication stages in a conventional technique, although the provision of the contact 9 is carried out in a different order. Additionally. the spacer thickness determining the offset length of the heavily doped source (drain) 16 can be designed with good allowance. As a result, heat-treatment margins increase and thus the process of planarization utilizing BSPG flow becomes available. The yield of upper-layer wirings and reliability improve. The short channel effect can be suppressed, and variations in characteristics are improved.

In the present embodiment, the first insulating layer 7 has a film thickness of 80 nm. However, by reducing the film thickness of the layer 7 down to less than one-half of the minimum inter-gate distance dwmin (i.e. the minimum value of dw), space necessary for the formation of the extraction electrode 13 is secured at every source drain contact area before carrying out an anisotropic etching. Therefore, the formation of the extraction electrode 13 is carried out in a self-alignment manner with respect to the gate electrode 4.

By determining the film thickness of the second insulating layer 14 in such a way that the sum of the film thickness of the second insulating layer 14 and the film thickness of the first insulating layer 7 is greater than one half of the minimum inter-gate distance dwmin, the spacer thickness can be secured effectively. Therefore, transistor characteristic variations become stable with respect to production variations, and reliability improves.

Further, by increasing the film thickness of the upper insulating layer 5 deposited on top of the gate electrode 4 by more than 20%of the film thickness of the first insulating layer 7, insulation between the gate electrode 4 and the extraction electrode 13 is well secured even if 15%or less over-etching is carried out to the first insulating layer 7 before the formation of the extraction electrode 13.

Furthermore, even if dw =0.1 $\mu$m, a gap of 0.04 $\mu$m will still be secured by depositing the first insulating layer 7 of FIG. 1 0.03 $\mu$m. Thus, the extraction electrode 13 can be formed in a self-alignment manner. The present example technique is available for at least up to 4G-bit DRAMs. DRAMs of a much higher-density become obtainable.

In the present embodiment, the extraction electrode 13 is provided between the gate electrodes 4. which, however. is not to be considered restrictive. The extraction electrode 13 may be provided in the peripheral transistor according the type of DRAM.

Further, in the present embodiment, the lightly doped source (drain) 6 is created by means of ion implantation after the formation of the gate electrode 4 and upper insulating layer 5 but before the formation of the extraction electrode 13. This, however, is not to be considered restrictive. It is possible to diffuse impurities, implanted into the polycrystalline silicon of the extraction electrode 13, into the silicon substrate 1 through a contact surface to form the lightly doped source (drain) 6.

Example II

Figure 3B:
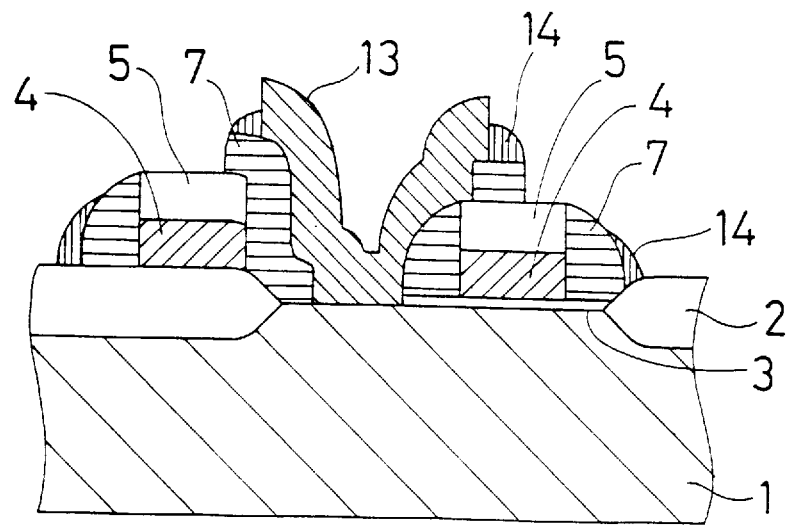
FIG. 3b is similar to FIG. 3a, but in crosssection.
Figure 4:
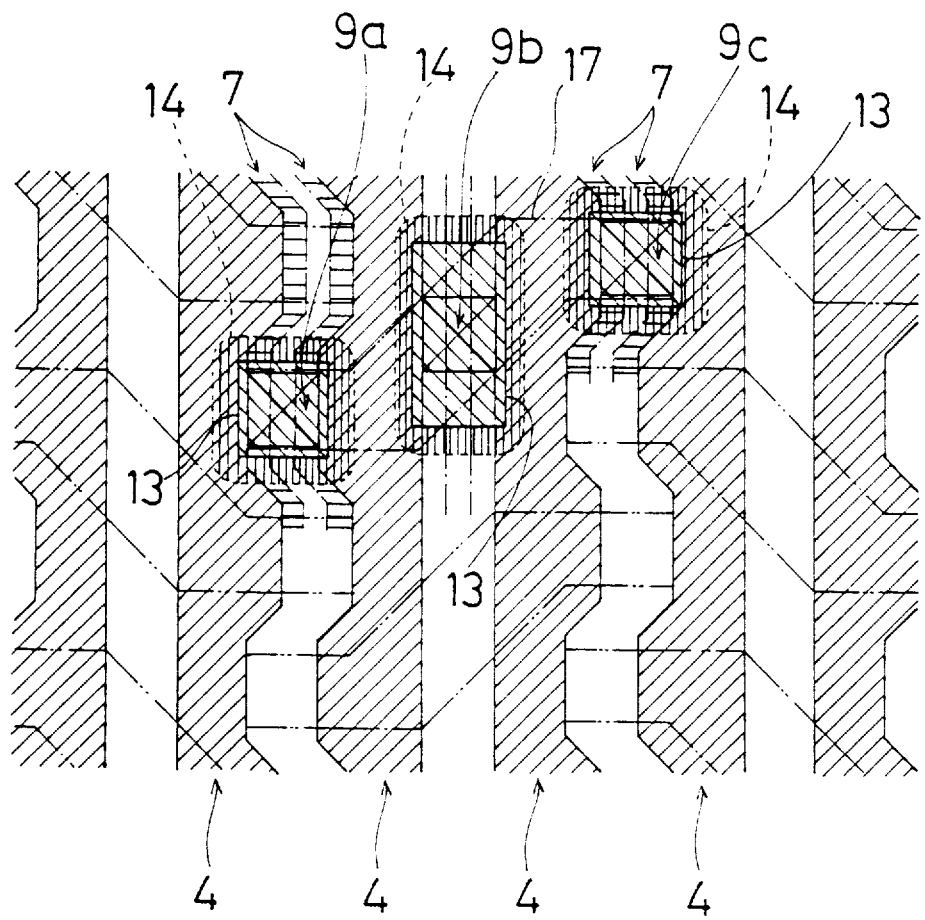
FIG. 4 is a plan view showing the structure of a memory cell of a modification of the second preferred embodiment.

Referring now to FIGS. 2 to 4, a second preferred embodiment of the invention is described below.

The second embodiment is identical with the first embodiment except for the following.

In the second embodiment:

(1) ion implantation into the polycrystalline silicon of the extraction electrode 13, as indicated by arrows II of FIG. lc, is not carried out: the resist 15 of FIG. If used to cover the memory cell when forming the heavily doped source (drain) region 16 is not provided; and impurities are introduced into the extraction electrode 13 the moment the heavily doped n–type source (drain) 16 is formed, and (2) Individual layers of the memory cell are arranged in a specific layout which is described later.

The above (1) is explained by reference to FIGS. 2a to 2f. Up to FIGS. 2a and 2b, the second embodiment is identical with the first embodiment. As described above, in the second embodiment, polycrystalline silicon is deposited in the present embodiment and an implantation of arsenic ions into the polycrystalline silicon to form the extraction electrode 13 is not carried out (see FIG. 2c). FIGS. 2d and 2e show the same stages that FIGS. id and le do. A spacer, made from the first and second insulating layers 7 and 14, is formed on the side walls of the gate electrode 4 (see FIG. 2f), which is the same as the first embodiment, but an implantation of impurities into the polycrystalline silicon electrode 13 of the memory cell and an implantation of impurities to form the heavily doped source (drain) 16, as indicated by arrows 11 and 20, are carried out at the same time. In the first embodiment, the resist mask 15 that covers the memory cell is employed. Conversely, in the second embodiment, a resist mask (not shown) not covering the memory cell is used.

As a result of the above, the number of fabrication stages can be reduced.

The above (2 ) is detailed by making reference to FIGS. 3a and 3b. FIG. 3a is a view showing a pattern layout after the stages of FIGS. 2a to 2f. FIG. 3b is a cross-sectional view taken along line A-A of FIG. 3a. As shown in the figure, a substrate activation zone 17 having source and drain regions is completely covered with the extraction electrode 13 of polycrystalline silicon, second insulating layer 14 left at the periphery of the extraction electrode 13, gate electrode 4, and first and second insulating layers 7 and 14 left at the periphery of the gate electrode 4.

As a result of such an arrangement, when carrying out the above-described two different ion implantations at a time. the substrate activation zone 17 of the memory cell does not surface. Therefore, the zone 17 is protected from impurities.

No pause time failures due to implantation defect occur in the memory cell. The reliability of high-density DRAM is improved if they are fabricated according to FIGS. 2a to 2f.

The extraction electrode 13 formed on the contact 9 between the gate electrodes 4 may be connected to bit lines or to storage capacitor electrodes. FIG. 4 is a modification of the second embodiment, showing one usual pattern layout for use in high-density DRAMs. In this modification, a center contact 9b is connected to a bit line, and a contact 9a is connected to a storage capacitor electrode, and a contact 9c is connected to a storage capacitor electrode. As a result of such a layout, the substrate activation zone 17 is completely covered with the gate electrode 4, first insulating layer 7 left at the periphery of the gate electrode 4, extraction electrode 13 of polycrystalline silicon 13, first and second insulating layers 7 and 14 left at the peripheral of the extraction electrode 13. The same effects as the second embodiment can be expected.

The extraction electrode 13 may be used as a storage capacitor electrode. In stead of using polycrystalline silicon, other similar materials may be used. Electrodes formed by such materials may be used as a wire. Further, this step may be used as a peripheral circuit's self-align contact.

The Invention claimed is:

1. A method of fabricating a high-density dynamic random-access memory (DRAM) comprising memory cells and a peripheral circuit, said DRAM fabrication method comprising the sequential steps of: (a) forming gate electrodes and upper insulating layers on top of said gate electrodes respectively in a first region of a substrate in which said memory cells are formed as well as in a second region of the substrate in which said peripheral circuit is formed; (b) forming source/drain regions in said first region: (c) depositing a first insulating layer on the substrate on which said gate electrodes are formed; (d) carrying out an anisotropic etching selectively to said first insulating layer in said first region to such an extend that a first side wall spacer composed of said first insulating layer is formed on the sides of said gate electrodes whereby source/drain contact areas in said first region are exposed, and thereafter forming extraction electrodes on said source/drain contact areas in said first region; (e) depositing a second insulating layer on the substrate; (f) carrying out an anisotropic etching t said first and second insulating layers in said second region, for selective removal in such a manner that a second side wall spacer composed of said first and second insulating layers is formed on the sides of said gate electrodes whereby at least source/drain contact areas in said second region are exposed; and (g) forming heavily doped source and drain regions in said second region by introducing impurities of a high concentration using partly or entirely said second side wall spacer as a mask.

2. The high-density DRAM fabrication method as in claim 1,
wherein the film thickness of said first insulating layer is smaller than one-half of the minimum distance of respective distance between said gate electrodes above said source/drain contact areas in said first region.

3. The high-density DRAM fabrication method as in claim 1 or 2,
Wherein the film thickness of said second insulating layer is so determined that the sum of the film thickness of said first insulating layer and the film thickness of said second insulating layer is greater than one-half of the minimum distance of respective distances between said gate electrodes above said source/drain contact areas in said first region.

4. The high-density DRAM fabrication method as in either claim 1 or 2,
wherein the film thickness of said upper insulating layer of said gate electrodes in said first region is greater than 1.2 times of the film thickness of said first insulating layer.

5. The high-density DRAM fabrication method as in claim 1,
wherein said extraction electrodeson said source/drain contact areas of said first region are made from polycrystalline silicon; and
an implantation of impurities into the polycrystalline silicon of said extraction electrodes and an implantation of impurities into said second region to form said heavily doped n-type source/drain regions are carried out at the same time.

* * * * *

UNITED STATES PATENT AND TRADEMARK OFFICE
CERTIFICATE OF CORRECTION

PATENT NO. : 5,856,219
DATED : January 5, 1999
INVENTOR(S) : Yasushi NAITO et al.

It is certified that error appears in the above-identified patent and that said Letters Patent is hereby corrected as shown below:

Col. 10,
    line 65, change "t" to --to--.

Col. 11,
    line 12, change "distance" to --distances--.

Col. 12,
    line 11, change "electrodeson" to --electrodes on--.

Signed and Sealed this

Twenty-fifth Day of May, 1999

Attest:

Q. TODD DICKINSON

Attesting Officer      Acting Commissioner of Patents and Trademarks